(12) United States Patent
Riho et al.

(10) Patent No.: US 12,394,456 B2
(45) Date of Patent: Aug. 19, 2025

(54) APPARATUSES AND METHODS INCLUDING DICE LATCHES IN A SEMICONDUCTOR DEVICE

(71) Applicant: MICRON TECHNOLOGY, INC., Boise, ID (US)

(72) Inventors: Yoshiro Riho, Koganei (JP); Hiroshi Akamatsu, Boise, ID (US); Jian Long, Xuhui (CN); Kevin G. Werhane, Kuna, ID (US); Liang Liu, Xuhui (CN); Yoshinori Fujiwara, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 238 days.

(21) Appl. No.: 18/335,385

(22) Filed: Jun. 15, 2023

(65) Prior Publication Data

US 2023/0343376 A1    Oct. 26, 2023

Related U.S. Application Data

(62) Division of application No. 17/575,378, filed on Jan. 13, 2022, now Pat. No. 11,727,967.

(51) Int. Cl.
*G11C 7/10* (2006.01)

(52) U.S. Cl.
CPC .................. *G11C 7/1087* (2013.01)

(58) Field of Classification Search
CPC .................................................... G11C 7/1087
USPC ...................................................... 365/189.05
See application file for complete search history.

(56) References Cited

U.S. PATENT DOCUMENTS

| | | | |
|---|---|---|---|
| 9,667,230 B1 | 5/2017 | Fojtik et al. | |
| 11,727,967 B2 | 8/2023 | Riho et al. | |
| 2018/0130518 A1 | 5/2018 | Ko | |
| 2020/0364155 A1* | 11/2020 | Pawlowski | H03M 13/6563 |
| 2020/0387329 A1* | 12/2020 | Choi | G11C 16/26 |
| 2021/0194470 A1* | 6/2021 | Maru | H03K 3/356078 |
| 2022/0014180 A1 | 1/2022 | Shlomo | |

OTHER PUBLICATIONS

U.S. Appl. No. 17/575,378, titled "Apparatuses and Methods Including Dice Latches in a Semiconductor Device" filed Jan. 13, 2022.

* cited by examiner

*Primary Examiner* — Anthan Tran
(74) *Attorney, Agent, or Firm* — Dorsey & Whitney LLP

(57) ABSTRACT

According to one or more embodiments, an apparatus comprising a plurality of dice latches, dice latch control logic, and a plurality of data input logic is provided. The dice latches are coupled in parallel and latch respective data. The dice latch control logic receives a load control signal and a reset control signal, provides a reset signal and further provides first and second load signals to the dice latches. The reset signal is based on the reset control signal. The first and second load signals are based on the load control signal and the reset control signal. The data input logic each are coupled to a respective one of the dice latches. Each of the data input logic receives a precharge control signal and respective input data and further provides data and complementary data to the respective one of the dice latches.

13 Claims, 7 Drawing Sheets

APPARATUSES AND METHODS INCLUDING DICE LATCHES IN A SEMICONDUCTOR DEVICE

CROSS-REFERENCE TO RELATED APPLICATION

This application is a divisional application of U.S. patent application Ser. No. 17/575,378, filed Jan. 13, 2022. This application is incorporated by reference herein in its entirety and for all purposes.

BACKGROUND

Dual interlocked storage cell (dice) latches are used to store critical data and are resistant to data errors that may be caused by radiation, for example, soft errors.

Dice latches can have complicated circuit designs that include many transistors. The more transistors included in a dice latch, however, the larger the circuit becomes, consuming greater area on a semiconductor die. When a semiconductor device, for example, a semiconductor memory device, includes hundreds of dice latches, the total area used for the dice latches can be significant. Additionally, dice latches having complicated circuit designs typically result in complicated circuit layouts on a semiconductor die that may be difficult to fabricate and require a greater number of steps to complete.

Thus, a dice latch design that is less complicated and includes a lower number of circuits is desirable.

DETAILED DESCRIPTION

Various embodiments of the present disclosure will be explained below in detail with reference to the accompanying drawings. The following detailed description refers to the accompanying drawings that show, by way of illustration, specific aspects in which embodiments of the present disclosure may be practiced. These embodiments are described in sufficient detail to enable those skilled in the art to practice the embodiments of present disclosure. Other embodiments may be utilized, and structure, logical and electrical changes may be made without departing from the scope of the present disclosure. The various embodiments disclosed herein are not necessary mutually exclusive, as some disclosed embodiments can be combined with one or more other disclosed embodiments to form new embodiments.

Certain details are set forth below to provide a sufficient understanding of embodiments of the disclosure. However, it will be clear to one skilled in the art that embodiments of the disclosure may be practiced without these particular details. Moreover, the particular embodiments of the present disclosure described herein are provided by way of example and should not be used to limit the scope of the disclosure to these particular embodiments. In other instances, well-known circuits, control signals, timing protocols, and software operations have not been shown in detail in order to avoid unnecessarily obscuring embodiments of the disclosure. Additionally, terms such as "couples" and "coupled" mean that two components may be directly or indirectly electrically coupled. Indirectly coupled may imply that two components are coupled through one or more intermediate components.

Figure 1:
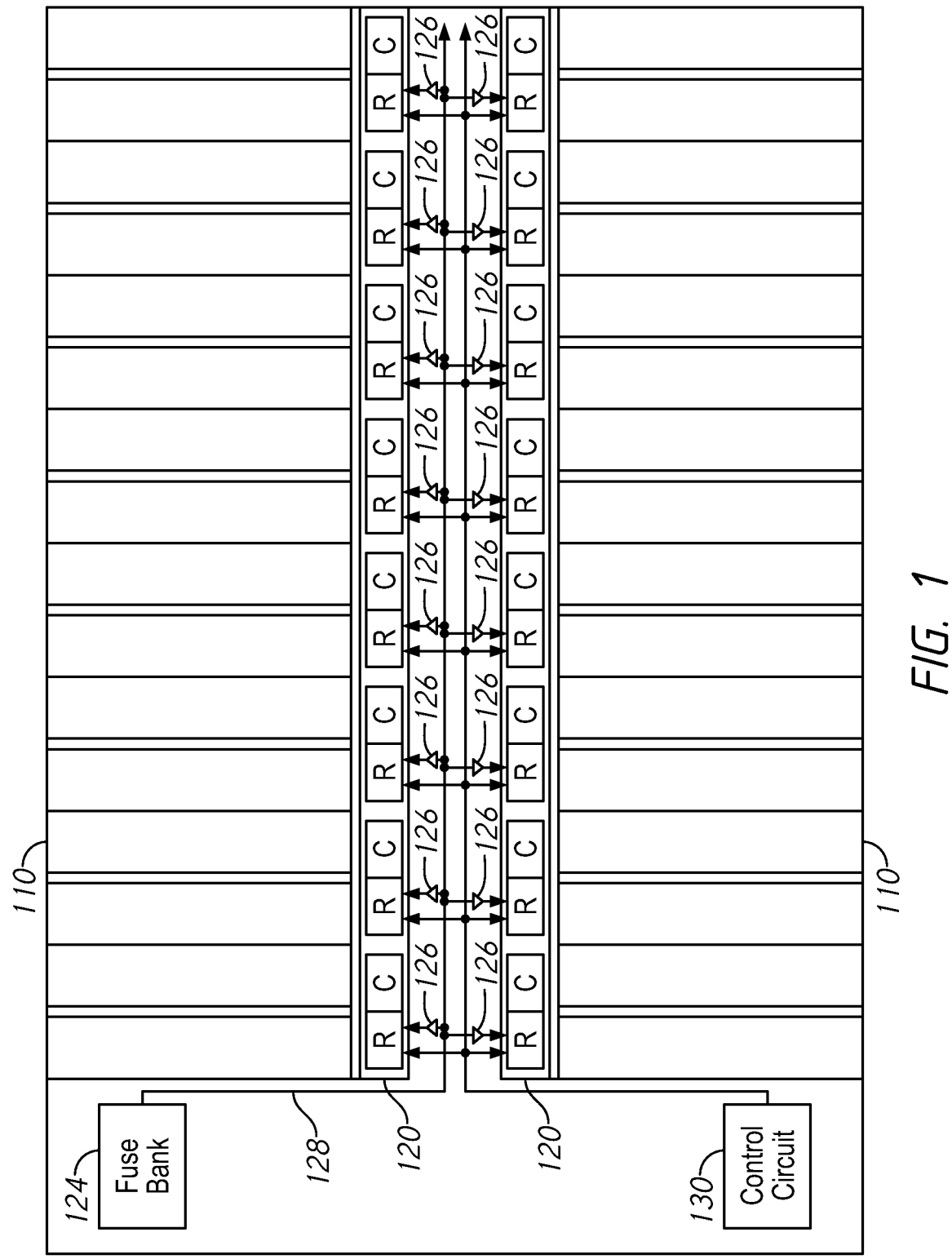
FIG. 1 is a schematic diagram of a semiconductor device according to an embodiment if the disclosure.

FIG. 1 is a schematic diagram of a semiconductor device 100 according to an embodiment if the disclosure. In some embodiments of the disclosure, the semiconductor device 100 is a memory device for storing data.

The semiconductor device 100 includes a memory array 110 that includes memory cells arranged in rows and columns. Some of the memory cells, referred to as redundant memory, are reserved for remapping addresses of memory cells that are defective. The redundant memory included in the memory array 110 are also arranged in rows and columns, referred to as redundant rows and redundant columns.

The semiconductor device 100 further includes redundancy latches 120 that are used to store addresses of defective memory cells. The redundancy latches 120 include redundancy latches assigned to redundant rows (R) and redundancy latches assigned to redundant columns (C). The addresses of the defective memory cells are permanently stored in a fuse bank 124, for example, a non-volatile storage space. When the semiconductor device 100 is initialized for operation, the redundancy latches 120 may be reset and addresses of the defective memory cells provided by the fuse bank 124 over a fuse bus 128 to data input logic 126 to be loaded into the redundancy latches 120. By loading the addresses of the defective memory cells into the redundancy latches 120, each of the addresses are assigned to a redundant memory location, such as a redundant row or redundant column. As a result, when an address of a known defective memory cell is accessed during operation, the redundant memory assigned to the matching address of the defective memory cells is accessed instead of the original, defective memory.

A control circuit 130 provides control signals to load the addresses of the defective memory cells into the redundancy latches 120. For example, the control circuit 130 may provide control signals to the redundancy latches 120 and the data input logic 126 to control the operation of circuits to load the addresses into the redundancy latches 120.

The redundancy latches 120 include dice latches to ensure that the loaded addresses of the defective memory cells are not corrupted or inadvertently change during operation of the semiconductor device, for example, due to a soft error or other malfunction.

Figure 2:
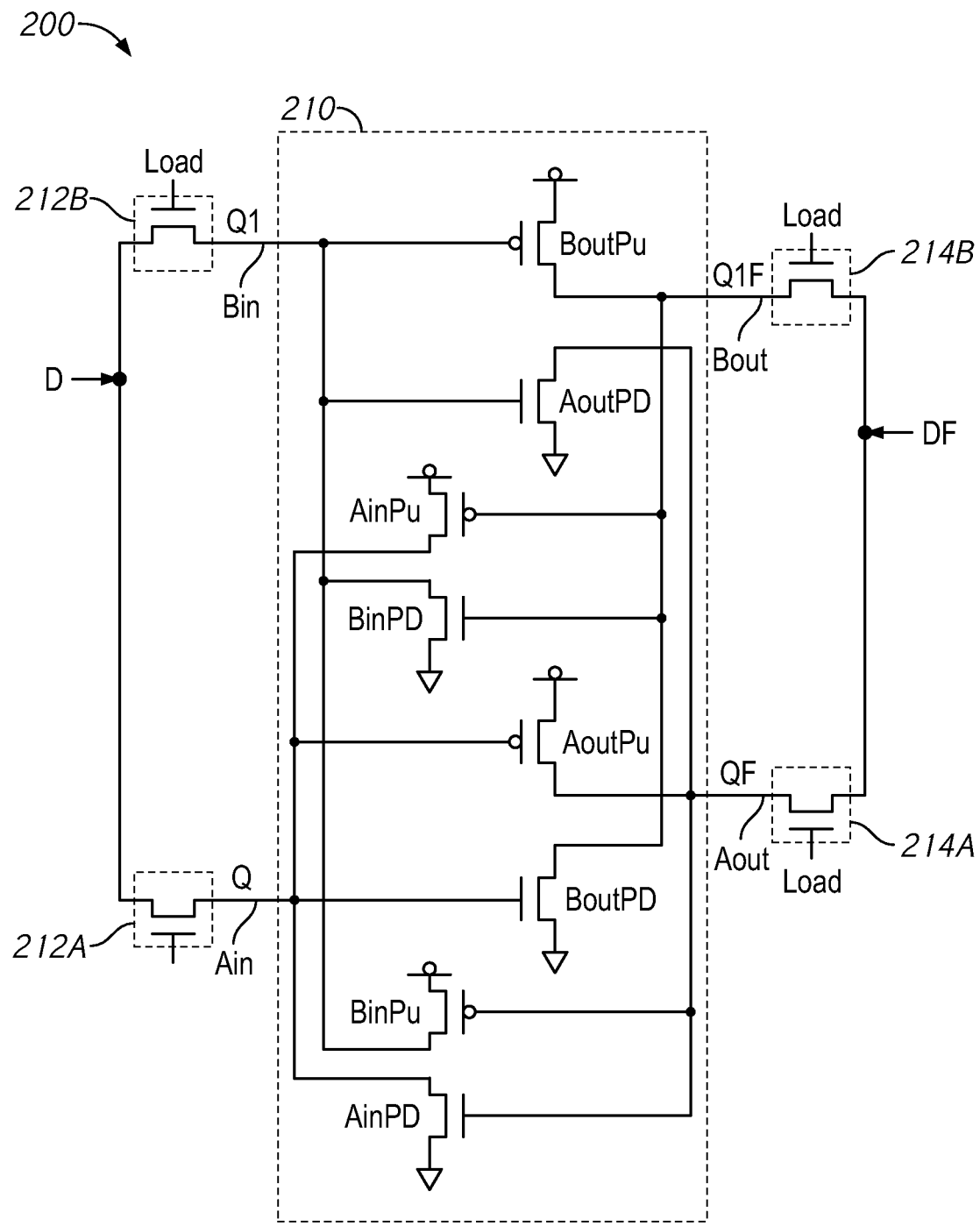
FIG. 2 is a schematic diagram of a dice latch according to an embodiment of the disclosure.

FIG. 2 is a schematic diagram of a dice latch 200 according to an embodiment of the disclosure. In some embodiments of the disclosure, the dice latch circuit 200 is included in the redundancy latches 120 of the semiconductor device 100 of FIG. 1.

The dice latch 200 includes a latch circuit 210 and data node switches 212A and 212B, and 214A and 214B. The latch circuit 210 is a combined dual latch circuit that includes two latches that are cross-coupled to each other. As will be described in more detail below, inputs and outputs of the latches included in the latch circuit 210 are provided to each other. The latch circuit 210 includes data nodes Ain and Bin, and further includes data nodes Aout and Bout. Each data node switch is coupled to a respective data node. For example, data node switch 212A is coupled to data node Ain, data node switch 212B is coupled to data node Bin, data node switch 214A is coupled to data node Aout, and data node switch 214B is coupled to data node Bout. The data node switches are activated and deactivated (e.g., switch closed and switch open, respectively) by a load signal. The load signal may be provided by a control circuit (e.g., control circuit 130 of FIG. 1, in some embodiments of the disclosure) that provides various control signals to control operation of the dice latch 200.

The load signal Load is shown in the embodiment of FIG. 2 as commonly provided to the data node switches 212A and 212B, and 214A and 214B. However, in some embodiments of the disclosure, different load signals may be provided to the data node switches 212A, 212B, 214A, and 214B. For example, in some embodiments of the disclosure, a load signal may be provided to the data node switches 212A and 214A and a different load signal may be provided to the data node switches 212B and 214B. In some embodiments of the disclosure, a different load signal is provided to each of the data node switches 212A, 212B, 214A, and 214B.

Data D is provided to data node switches 212A and 212B and complementary data DF is provided to data node switches 214A and 214B. The complementary data DF represents data having a logic level that is complementary to the logic level of the data represented by data D. The data D and complementary data DF may be provided on data lines to the dice latch 200 by data input logic, for example, data input logic 126 of FIG. 1 in some embodiments of the disclosure. When the data node switches 212A and 212B are activated, the data D is provided to the data nodes Ain and Bin, respectively. When the data node switches 214A and 214B are activated, the complementary data DF is provided to the data nodes Aout and Bout, respectively.

The latch circuit 210 includes pull-up circuits and pull-down circuits coupled to the data nodes, and each of the pull-up circuits is provided a high logic level voltage and each of the pull-down circuits is provided a low logic level voltage. A pull-up circuit AoutPU is coupled to data node Aout and has a control node coupled to data node Ain, and a pull-down circuit AoutPD is coupled to data node Aout and has a control node coupled to data node Bin. A pull-up circuit AinPU is coupled to data node Ain and has a control node coupled to data node Bout, and pull-down circuit AinPD is coupled to data node Aout. Similarly, pull-up circuit BoutPU is coupled to data node Bout and has a control node coupled to data node Bin, and pull-down circuit BoutPD is coupled to data node Bout and has a control node coupled to data node Ain. A pull-up circuit BinPU is coupled to data node Bin and has a control node coupled to data node Aout, and a pull-down circuit BinPD is coupled to data node Bin and has a control node coupled to data node Bout.

The pull-up circuits provide the high logic level voltage to the respective data node when activated by an active voltage provided to the respective control node (e.g., active low logic level voltage), and the pull-down circuits provide the low logic level voltage to the respective data node when activated by an active voltage provided to the respective control node (e.g., active high logic level voltage).

In the embodiment of FIG. 2, the pull-down circuits of the latch circuit 210 and the data node switches 212A and 212B, and 214A and 214B are shown to include n-channel transistors, and the pull-up circuits of the latch circuit 210 are shown to include p-channel transistors. However, in other embodiments of the disclosure, the pull-down, pull-up, and/or data node switches may include additional and/or other circuits than n-channel and p-channel transistors. For example, other types of transistors may be included, additional n- and p-channel transistors included, as well as alternative/additional circuits may be included.

Figure 6:
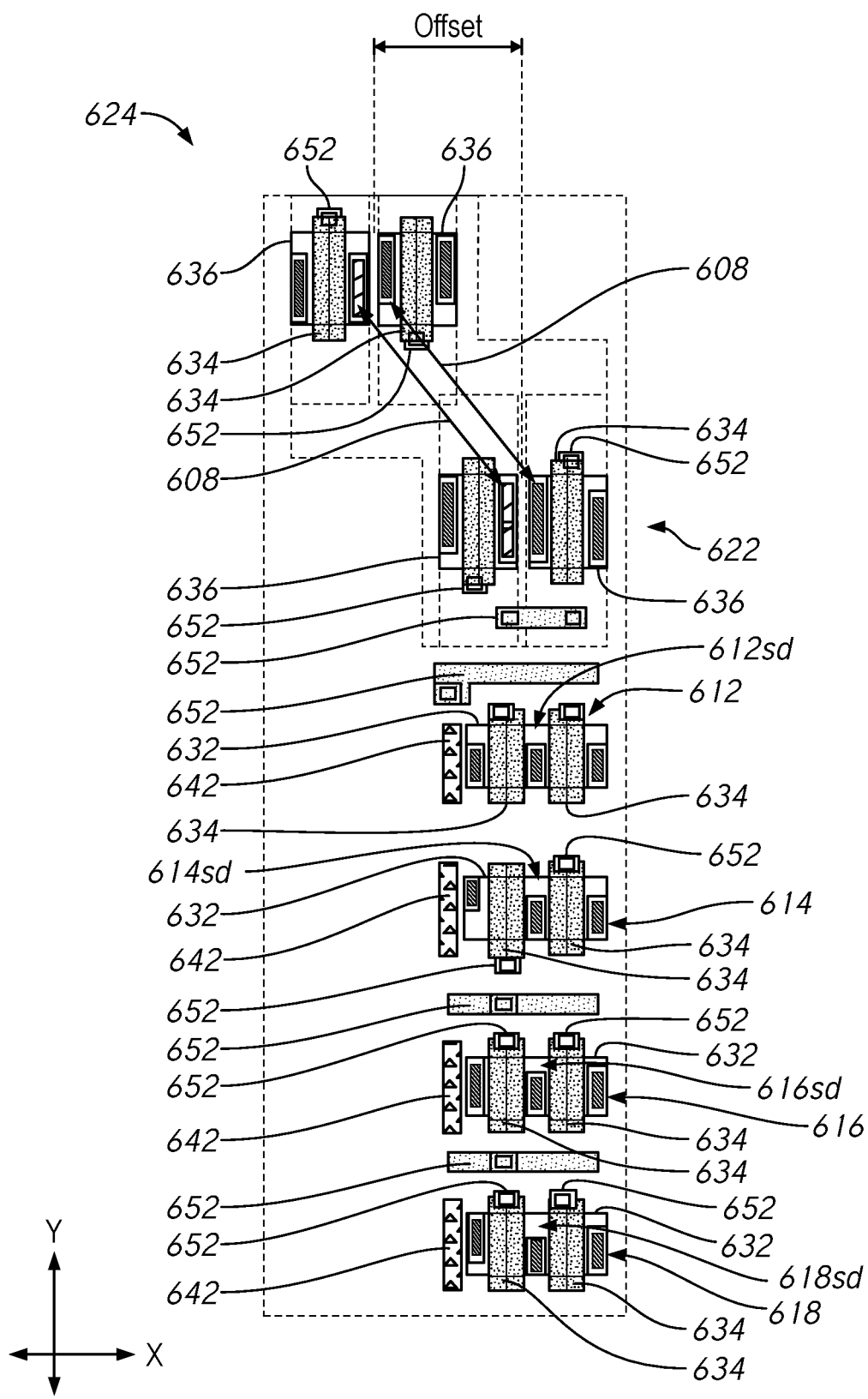
FIG. 6 is a layout diagram for a dice latch according to an embodiment of the disclosure.

The dice latch 200 of FIG. 2 includes 12 transistors, which is fewer transistors compared to conventional dice latches. Conventional dice latches may typically include, for example, 16 transistors. The combined dual latch circuit configuration of the latch circuit 210 provides reliability the data D and complementary data DF that is latched remains valid and uncorrupted during normal operation. For example, the dice latch 200 may have robustness against soft errors, such as data errors caused by neutron strikes or other atomic particles striking the semiconductor device. FIG. 6

In operation, when the data node switches 212A and 212B, and 214A and 214B are activated (e.g., switch closed) by an active load signal Load (e.g., active high signal), data D and complementary data DF are loaded into the latch circuit 210 and latched, and provided as output data Q and Q1 and complementary output data QF and Q1F.

For example, assuming data D is a high logic level (e.g., a data "1"; a high logic level voltage) and complementary data DF is a low logic level (e.g., a data "0"; a low logic level voltage), when an active Load signal is provided to the data node switches 212A and 212B, and 214A and 214B the high logic level of data D is provided to the data nodes Ain and Bin and the low logic level of complementary data DF is provided to the data nodes Aout and Bout. The high logic level at data nodes Ain and Bin activate pull-down circuits AoutPD and BoutPD. As a result, data node Aout is pulled down to the low logic level voltage by the activated pull-down circuit AoutPD to provide output data QF having a low logic level and the data node Bout is pulled down to the low logic level voltage by the activated pull-down circuit BoutPD to provide output data Q1F having a low logic level. In turn, the low logic level voltage at data node Aout activates pull-up circuit BinPU to pull up data node Bin to the high logic level voltage to maintain data Q1 at a high logic level. Similarly, the low logic level voltage at data node Bout activates pull-up circuit AinPU to pull up data node Ain to the high logic level voltage to maintain data Q at a high logic level. In this manner, the data D and complementary data DF are latched by the latch circuit 210. The data node switches 212A and 212B, and 214A and 214B may be deactivated (e.g., switch opened) by deactivating the Load signal after the data D and the complementary data DF are latched.

In another example, assuming that data D is a low logic level (e.g., a data "0"; a low logic level voltage) and complementary data DF is a high logic level (e.g., a data "1"; a high logic level voltage), when an active Load signal is provided to the data node switches 212A and 212B, and 214A and 214B the low logic level of data D is provided to the data nodes Ain and Bin and the high logic level of complementary data DF is provided to the data nodes Aout and Bout. The low logic level at data nodes Ain and Bin activate pull-up circuits AoutPU and BoutPU. As a result, data node Aout is pulled up to the high logic level voltage by the activated pull-up circuit AoutPU to provide output data QF having a high logic level and the data node Bout is pulled up to the high logic level voltage by the activated pull-up circuit BoutPU to provide output data Q1F having a high logic level. In turn, the high logic level voltage at data node Aout activates pull-down circuit BinPD to pull down data node Bin to the low logic level voltage to provide data Q1 having a low logic level. Similarly, the high logic level voltage at data node Bout activates pull-down circuit AinPD to pull down data node Ain to the low logic level voltage to provide data Q having a low logic level. In this manner, the data D and complementary data DF are latched by the latch circuit 210. The data node switches 212A and 212B, and 214A and 214B may be deactivated (e.g., switch opened) by deactivating the Load signal after the data D and the complementary data DF are latched.

Figure 3:
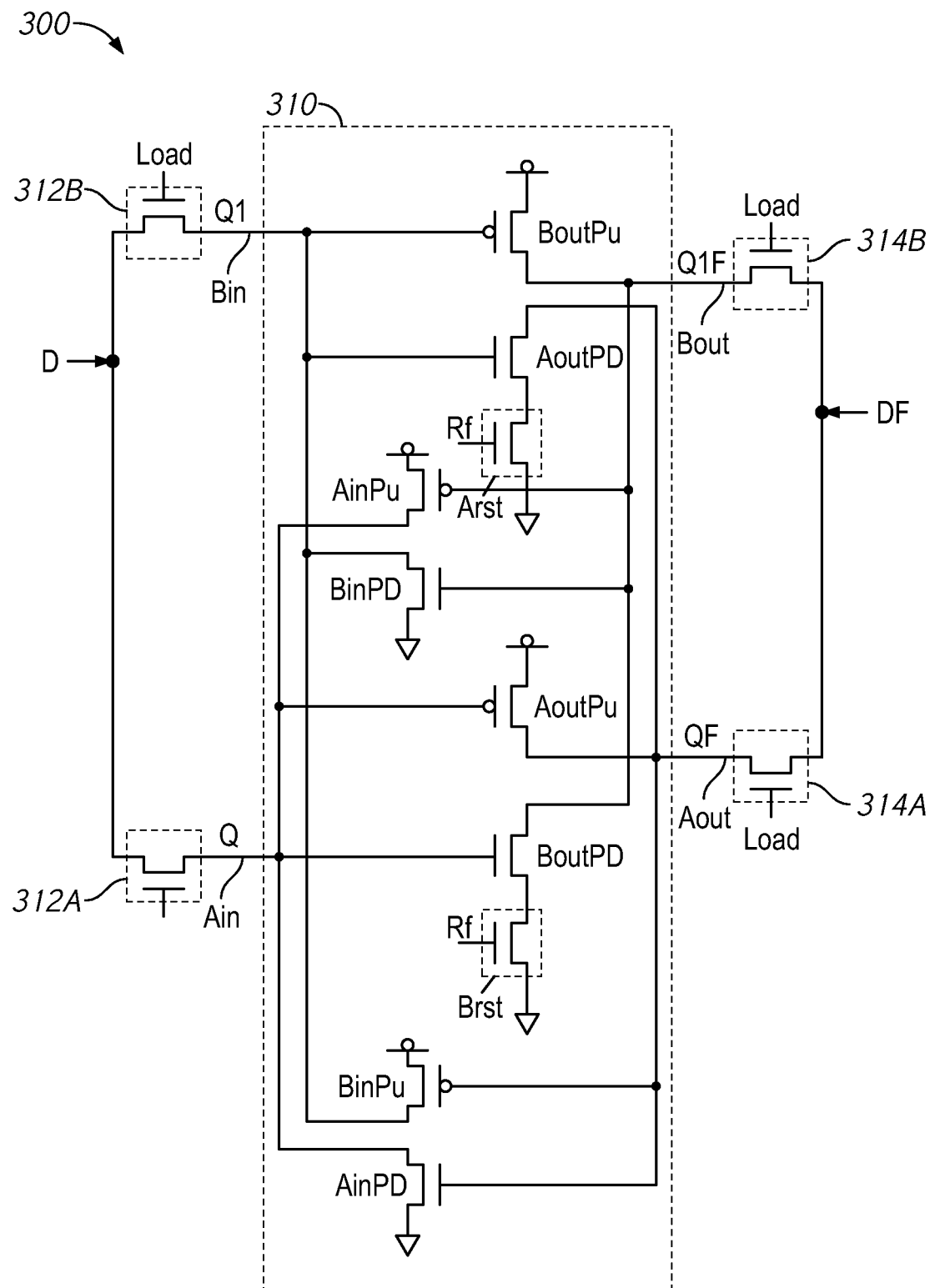
FIG. 3 is a schematic diagram of a dice latch according to an embodiment of the disclosure.

FIG. 3 is a schematic diagram of a dice latch 300 according to an embodiment of the disclosure. In some embodiments of the disclosure, the latch circuit 300 is included in the redundancy latches 120 of the semiconductor device 100 of FIG. 1.

The dice latch 300 includes a latch circuit 310 and data node switches 312A and 312B, and 314A and 314B. The latch circuit 310 is a combined dual latch circuit that includes two latches that are cross-coupled to each other. As will be described in more detail below, inputs and outputs of the latches included in the latch circuit 310 are provided to each other. The latch circuit 310 includes data nodes Ain and Bin, and further includes data nodes Aout and Bout. Each data node switch is coupled to a respective data node. For example, data node switch 312A is coupled to data node Ain, data node switch 312B is coupled to data node Bin, data node switch 314A is coupled to data node Aout, and data node switch 314B is coupled data node Bout. The data node switches are activated and deactivated (e.g., switch closed and switch opened, respectively) by a load signal. The load signal may be provided by a control circuit (e.g., control circuit 130 of FIG. 1, in some embodiments of the disclosure) that provides various control signals to control operation of the dice latch 300.

The load signal Load is shown in the embodiment of FIG. 3 as commonly provided to the data node switches 312A and 312B, and 314A and 314B. However, in some embodiments of the disclosure, different load signals may be provided to the data node switches 312A, 312B, 314A, and 314B. For example, in some embodiments of the disclosure, a load signal may be provided to the data node switches 312A and 314A and a different load signal may be provided to the data node switches 312B and 314B. In some embodiments of the disclosure, the load signal provided to data node switches 312A, 312B is different from the load signal provided to data node switches 314A, and 314B.

Data D is provided to data node switches 312A and 312B and complementary data DF is provided to data node switches 314A and 314B. The complementary data DF represents data having a logic level that is complementary to the logic level of the data represented by the data D. The data D and complementary data DF may be provided on data lines to the dice latch 300 by data input logic, for example, data input logic 126 of FIG. 1 in some embodiments of the disclosure. When the data node switches 312A and 312B are activated, the data D is provided to the data nodes Ain and Bin, respectively. When the data node switches 314A and 314B are activated, the complementary data DF is provided to the data nodes Aout and Bout, respectively.

The latch circuit 310 includes pull-up circuits and pull-down circuits coupled to the data nodes. Each of the pull-up circuits is provided a high logic level voltage and each of the pull-down circuits is provided a low logic level voltage. A pull-up circuit AoutPU is coupled to data node Aout and has a control node coupled to data node Ain, and a pull-down circuit AoutPD is coupled to data node Aout and has a control node coupled to data node Bin. A pull-up circuit AinPU is coupled to data node Ain and has a control node coupled to data node Bout, and pull-down circuit AinPD is coupled to data node Aout. Similarly, pull-up circuit BoutPU is coupled to data node Bout and has a control node coupled to data node Bin, and pull-down circuit BoutPD is coupled to data node Bout and has a control node coupled to data node Ain. A pull-up circuit BinPU is coupled to data node Bin and has a control node coupled to data node Aout, and a pull-down circuit BinPD is coupled to data node Bin and has a control node coupled to data node Bout.

The pull-up circuits provide the high logic level voltage to the respective data node when activated by an active voltage provided to the respective control node (e.g., active low logic level voltage), and the pull-down circuits provide the low logic level voltage to the respective data node when activated by an active voltage provided to the respective control node (e.g., active high logic level voltage).

The latch circuit 310 further includes reset circuits Arst and Brst. The reset circuit Arst is coupled to pull-down circuit AoutPD and to the low logic level voltage and the reset circuit Brst is coupled to pull-down circuit BoutPD. A reset signal Rf is provided to the reset circuits Arst and Brst to control activation. The reset signal may be provided by a control circuit (e.g., control circuit 130 of FIG. 1, in some embodiments of the disclosure) that provides various control signals to control operation of the dice latch 300.

The reset circuits Arst and Brst provide the low logic level voltage to the pull-down circuits AoutPD and BoutPD, respectively, when deactivated by an inactive reset signal Rf (e.g., inactive high logic level signal). Conversely, the low logic level voltage is not provided to the pull-down circuits AoutPD and BoutPD when the reset circuits Arst and Brst, respectively, are activated by an active reset signal Rf (e.g., active low logic level signal).

The reset signal Rf is shown in the embodiment of FIG. 3 as being commonly provided to the reset circuits Arst and Brst. However, in some embodiments of the disclosure, different reset signals may be provided to each of the reset circuits Arst and Brst. For example, in some embodiments of the disclosure, a reset signal may be provided to the reset circuit Arst and a different reset signal may be provided to the reset circuit Brst.

In the embodiment of FIG. 3, the pull-down circuits of the latch circuit 310 and the data node switches 312A and 312B, and 314A and 314B are shown to include n-channel transistors, and the pull-up circuits of the latch circuit 310 are shown to include p-channel transistors. The reset circuits Arst and Brst are shown in FIG. 3 as including n-channel transistors. However, in other embodiments of the disclosure, the pull-down, pull-up, data node switches, and/or reset circuits may include additional and/or other circuits than n-channel and p-channel transistors. For example, other types of transistors may be included, additional n- and p-channel transistors included, as well as alternative/additional circuits may be included.

The dice latch 300 of FIG. 3 includes 14 transistors, which is fewer transistors compared to conventional dice latches. As previously described, conventional dice latches may typically include, for example, 16 transistors. The combined dual latch circuit configuration of the latch circuit 310 provides reliability the data D and complementary data DF that is latched remains valid and uncorrupted during normal operation. For example, the dice latch 300 may have robustness against soft errors, such as data errors caused by neutron strikes or other atomic particles striking the semiconductor device. The dice latch 300 may be used in applications where data integrity is critical and latch circuits that are more resistant to soft errors and the like are desirable. Additionally, the dice latch 300 includes reset circuits Arst and Brst that facilitate resetting of the Ain and Bin data nodes to a low logic level voltage when an active reset signal Rf is provided to the reset circuits Arst and Brst.

In operation, data D and complementary data DF are loaded into the latch circuit 310 and latched to be provided as output data Q and Q1 and complementary output data QF and Q1F when the data node switches 312A and 312B, and 314A and 314B are activated (e.g., switch closed) by an active load signal Load (e.g., active high signal), and the reset circuits Arst and Brst are deactivated by an inactive reset signal Rf.

For example, assuming that data D is a high logic level (e.g., a data "1"; a high logic level voltage) and complementary data DF is a low logic level (e.g., a data "0"; a low logic level voltage), when an active Load signal is provided to the data node switches 312A and 312B, and 314A and 314B the high logic level of data D is provided to the data nodes Ain and Bin and the low logic level of complementary data DF is provided to the data nodes Aout and Bout. The high logic level at data nodes Ain and Bin activate pull-down circuits AoutPD and BoutPD. As a result, data node Aout is pulled down to the low logic level voltage by the activated pull-down circuit AoutPD and the deactivated reset circuit Arst to provide output data QF having a low logic level and the data node Bout is pulled down to the low logic level voltage by the activated pull-down circuit BoutPD and the deactivated reset circuit Brst to provide output data Q1F having a low logic level. In turn, the low logic level voltage at data node Aout activates pull-up circuit BinPU to pull up data node Bin to the high logic level voltage to provide data Q1 having a high logic level. Similarly, the low logic level voltage at data node Bout activates pull-up circuit AinPU to pull up data node Ain to the high logic level voltage to provide data Q having a high logic level. In this manner, the data D and complementary data DF are latched by the latch circuit 310. The data node switches 312A and 312B, and 314A and 314B may be deactivated (e.g., switch opened) by deactivating the Load signal after the data D and the complementary data DF are latched.

In another example, assuming that data D is a low logic level (e.g., a data "0"; a low logic level voltage) and complementary data DF is a high logic level (e.g., a data "1"; a high logic level voltage), when an active Load signal is provided to the data node switches 312A and 312B, and 314A and 314B the low logic level of data D is provided to the data nodes Ain and Bin and the high logic level of complementary data DF is provided to the data nodes Aout and Bout. The low logic level at data nodes Ain and Bin activate pull-up circuits AoutPU and BoutPU. As a result, data node Aout is pulled up to the high logic level voltage by the activated pull-up circuit AoutPU to provide output data QF having a high logic level and the data node Bout is pulled up to the high logic level voltage by the activated pull-up circuit BoutPU to provide output data Q1F having a high logic level. In turn, the high logic level voltage at data node Aout activates pull-down circuit BinPD to pull down data node Bin to the low logic level voltage to provide data Q1 having a low logic level. Similarly, the high logic level voltage at data node Bout activates pull-down circuit AinPD to pull down data node Ain to the low logic level voltage to provide data Q having a low logic level. In this manner, the data D and complementary data DF are latched by the latch circuit 310. The data node switches 312A and 312B, and 314A and 314B may be deactivated (e.g., switch opened) by deactivating the Load signal after the data D and the complementary data DF are latched.

To reset the dice latch 300, an active (low) reset signal Rf is provided to the reset circuits Arst and Brst. As a result, the low logic level voltage is not provided to the pull-down circuit AoutPD and BoutPD and the data nodes Aout and Bout are floating, removing a load on the data nodes. Additionally, an active Load signal is provided to the data node switches 312A and 312B, and 314A and 314B with data D at a low logic level and complementary data DF at a high logic level. With the data node switches 312A and 312B, and 314A and 314B activated, the low logic level data D is loaded to provide data Q and Q1 having a low logic level and the high logic level complementary data DF is loaded to provide data QF and Q1F having a high logic level. The low logic level of data D activates pull-up circuits AoutPU and BoutPU to pull up the respective data nodes Aout and Bout (which are floating and the load on the data nodes is reduced) to the high logic level voltage. The high logic level of complementary data DF activates the pull-down circuits AinPD and BinPD to pull down the respective data nodes Ain and Bin to the low logic level voltage. Thus, when the reset circuits Arst and Brst are activated by an active reset signal Rf, loads on the data nodes Aout and Bout are reduced and a low logic level is written to and latched by the dice latch 300 (e.g., data Q and Q1 at a low logic level and data QF and Q1F at a high logic level). In this manner, the dice latch 300 is reset to have a low logic level latched for data Q and Q1.

Figure 4:
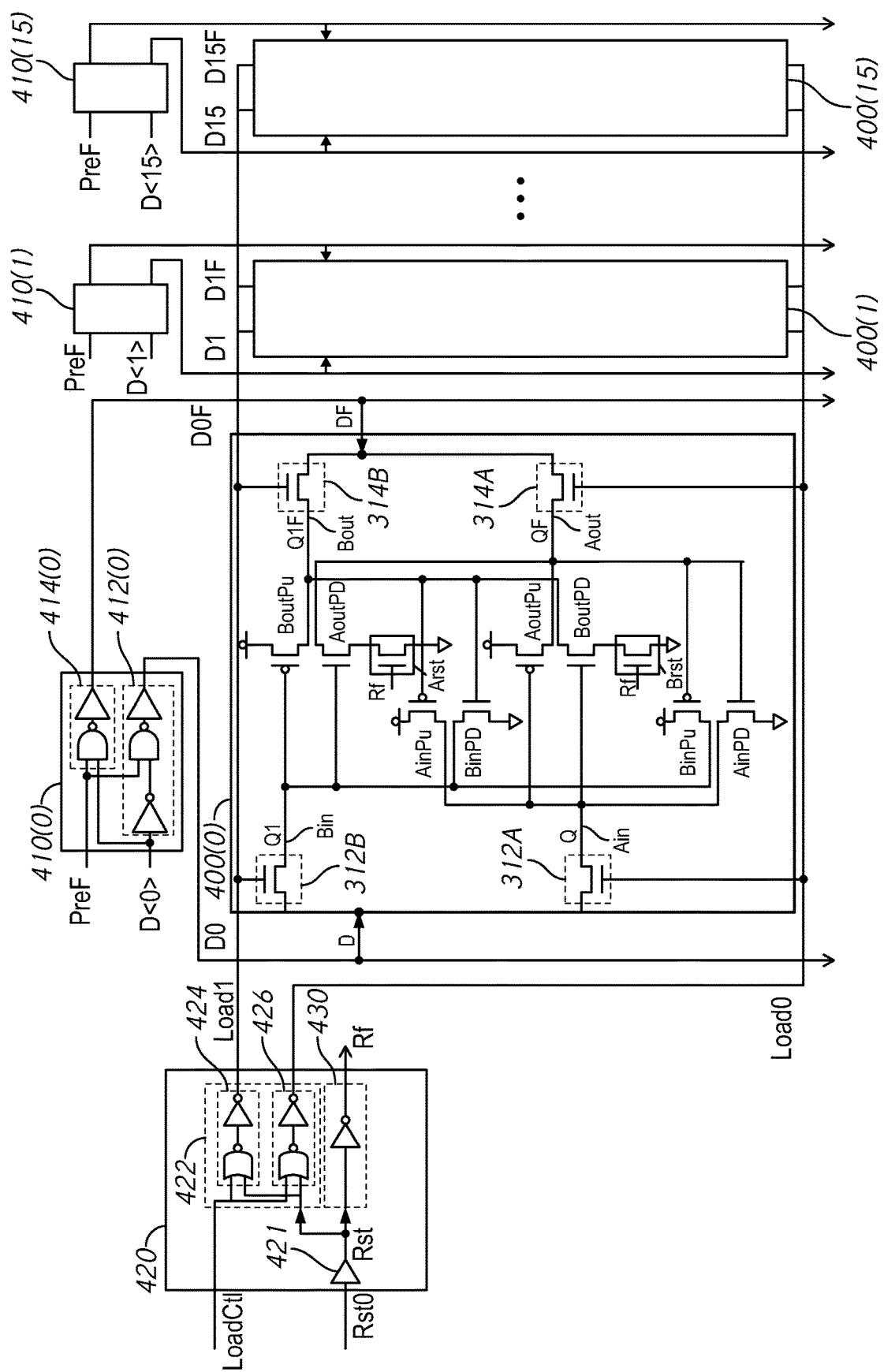
FIG. 4 is a block diagram of parallel-coupled dice latches according to an embodiment of the disclosure.

In some embodiments of the disclosure, dice latches are coupled in parallel, and multi-bit data may be loaded into and latched by the parallel-coupled dice latches. FIG. 4 is a block diagram of parallel-coupled dice latches according to an embodiment of the disclosure. In some embodiments of the disclosure, the latch circuit parallel-coupled dice latches of FIG. 4 may be included in the redundancy latches 120 of the semiconductor device 100 of FIG. 1.

FIG. 4 shows dice latches 400(0)-400(15) coupled in parallel. While FIG. 4 shows 16 dice latches in parallel, other embodiments may include greater or fewer dice latches in parallel. For example, in some embodiments, 32 dice latches are coupled in parallel. In some embodiments, 8 dice latches are coupled in parallel.

In the example embodiment of FIG. 4, the dice latches 400(0)-400(15) include the dice latch 300 shown in FIG. 3. However, the dice latches 400(0)-400(15) are not limited to those specifically shown in FIG. 4. For example, in some embodiments of the disclosure, the dice latches 400(0)-400(15) include dice latch 200 shown in FIG. 2. In some embodiments of the disclosure, dice latches 400(0)-400(15) include a dice latch different than dice latch 300 or dice latch 200.

Load signals Load0 and Load1 are provided to the dice latches 400(0)-400(15) by dice latch control logic 420. The dice latch control logic 420 may be included in a control circuit, for example, control circuit 130 of the semiconductor device 100 of FIG. 1 in some embodiments of the disclosure. When load signals Load0 and Load1 are active (e.g., active high signals), the dice latches 400(0)-400(15) load data D and complementary data DF to be latched by the respective dice latch 400. The dice latch control logic 420 also provides a reset signal Rf to the dice latches 400(0)-

400(15). An active reset signal Rf (e.g., active low signal) facilitates resetting of the dice latches 400(0)-400(15), for example, to set data nodes Ain and Bin to a low logic level and set data nodes Aout and Bout to a high logic level.

The dice latch control logic 420 includes load control logic 422 and reset control logic 430. The dice latch control logic 420 receives a load control signal LoadCt1 and a reset control signal Rst0. The load control signal LoadCt1 may be provided by a command decoder that provides control signals to perform various operations on a semiconductor device. Likewise, the reset control signal Rst0 may also be provided by a command decoder. The reset control signal Rst0 is provided through a buffer 421 to the reset control logic 430 as a Rst signal. The reset control logic 430 provides the reset signal Rf in response to the Rst signal. In some embodiments of the disclosure, the reset control logic 430 includes an inverter circuit to provide the reset signal Rf.

Figure 5:
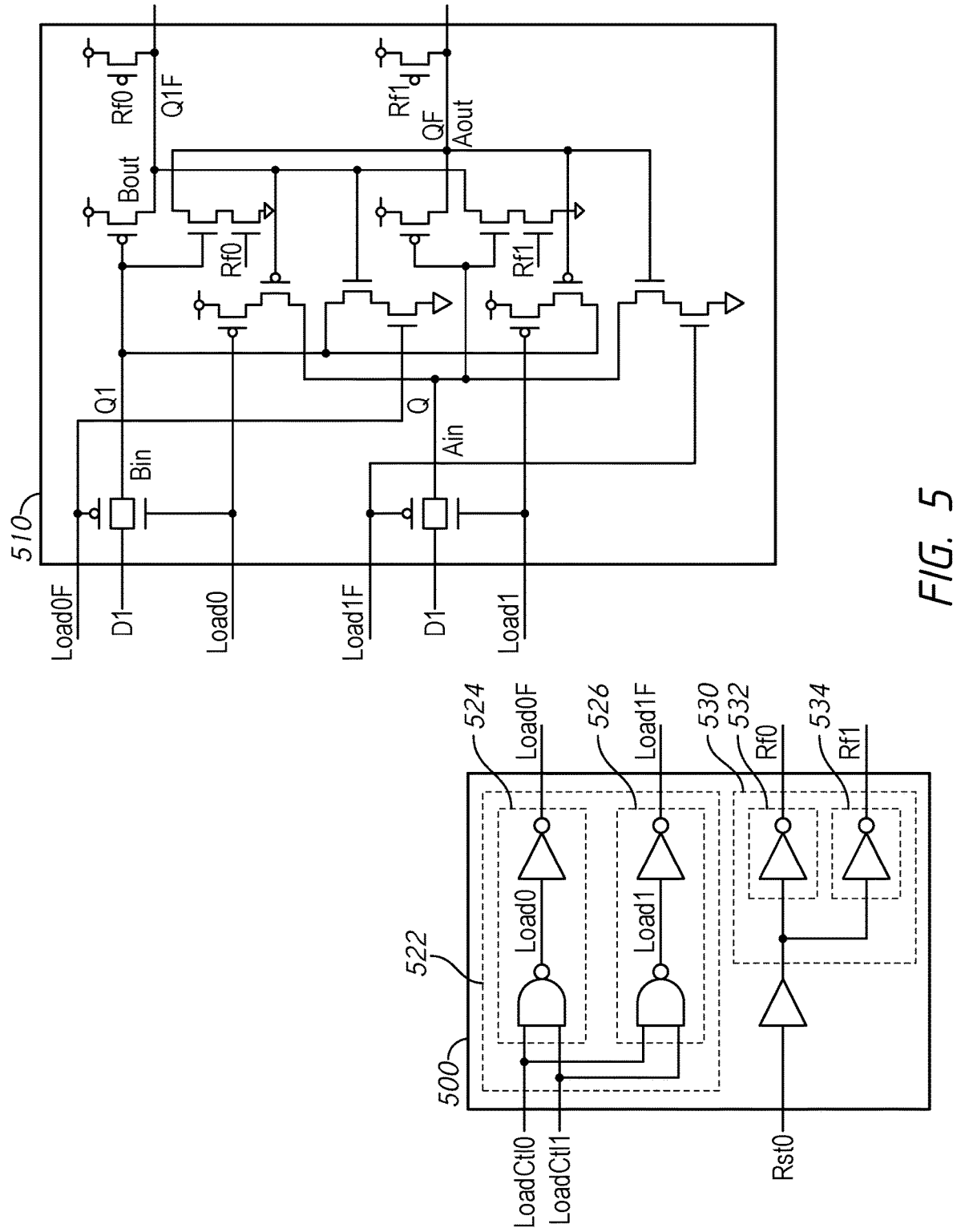
FIG. 5 is a schematic diagram of a dice latch control logic according to an embodiment of the disclosure and a dice latch.

Although not shown in FIG. 4, in some embodiments of the disclosure the reset control logic 430 provides separate reset signals to the reset circuits of the dice latches 400. For example, in such embodiments of the disclosure, the reset control logic 430 provides one reset signal to the reset circuit Arst for the data node Aout and another reset signal to the reset circuit Brst for the data node Bout. Each of the reset signals may be provided by a separate reset signal circuit. An example of reset control logic that provides separate reset signals will be described in more detail below with reference to a reset control logic 530 of FIG. 5. In some embodiments of the disclosure, the reset control logic 530 of FIG. 5 is substituted for the reset control logic 430 in the dice control logic 420 to provide separate reset signals Rf0 and Rf1. Each of the reset signals Rf0 and Rf1 is provided to a different reset circuit of a dice latch 400.

With reference to FIG. 4 and the dice latch control logic 420, the reset control signal Rst0 is also provided through the buffer 421 as the Rst signal to the load control logic 422. The load control logic also receives the load control signal LoadCt1. The load control logic 422 includes load signal logic 424 and 426. The load signal logic 424 and 426 receive the load control signal LoadCt1 and the Rst signal, and provide a respective load signal. For example, the load signal logic 424 provides the load signal Load1 and the load signal logic 426 provides the load signal Load0. Active load signals Load0 and Load1 (e.g., active high signal) are provided when the reset control signal Rst0 is inactive (e.g., inactive low signal) and the load control signal LoadCt1 is active (e.g., active high signal). When the reset control signal Rst0 is active (e.g., active high signal), the load control logic 422 provides active load signals Load0 and Load1 regardless of the state of the load control signal LoadCt1.

As previously described, active load signals Load0 and Load1 cause data D and complementary data DF to be loaded and latched by the dice latches 400(0)-400(15). Conversely, inactive load signals Load0 and Load1 cause the dice latches to maintain the latched data states regardless of any changes to the respective data D and complementary data DF.

The data D and complementary data DF for each of the dice latches 400(0)-400(15) is provided on data lines by a respective data input logic 410(0)-410(15). The data input logic 410(0)-410(15) may be included in data input logic, for example, data input logic 126 of the semiconductor device 100 of FIG. 1 in some embodiments of the disclosure. Input data D<n> (n corresponding to the respective data input logic) and precharge control signal PreF are provided to the data input logic 410(n). The data input logic 410 includes data logic 412 and complementary data logic 414. When the precharge control signal PreF is inactive (e.g., inactive high signal), the data logic 412 provides the input data D<n> as data Dn to the respective dice latch 400(n), and the data logic 414 provides complementary data DnF to the respective dice latch 400(n). When the precharge control signal PreF is active (e.g., active low signal), the data logic 412 provides high logic level data Dn and the data logic 414 provides high logic level complementary data DnF regardless of the logic level of the data D<n> (e.g., the data Dn and the complementary data DnF have a same logic level).

In operation, when the precharge control signal PreF is inactive, data D<n> provided to the respective data input logic 410(n) is provided as data Dn and complementary data DnF on data lines to the respective dice latch 400(n) (e.g., D<0> provided to data input logic 410(0) is provided as D0 and D0F to dice latch 400(0), D<1> provided to data input logic 410(1) is provided as D1 and D1F to dice latch 400(1), and so on). To load the data Dn and complementary data DnF into the respective dice latch 400(n), an inactive reset control signal Rst0 and an active load control signal LoadCt1 are provided to the dice latch control logic 420. As a result, the dice latch control logic 420 provides active load signals Load0 and Load1 to the dice latches 400(0)-400(15). With the active load signals Load0 and Load1, data Dn and complementary data DnF on respective data lines are loaded into the respective dice latches 400(n) and latched. Following the latching of the data Dn and complementary data DnF by the respective dice latches 400(n), an inactive load control signal LoadCt1 may be provided to the dice latch control logic 420 to cause the dice latch control logic 420 to provide inactive load signals Load0 and Load1 to the dice latches 400(0)-400(15). With the inactive load signals Load0 and Load1, the respective data Dn and complementary data DnF already loaded and latched is maintained by the dice latches 400(0)-400(15).

In some embodiments of the disclosure, an active PreF signal (e.g., low logic level PreF signal) may be provided following the loading and latching of data D<n> by the dice latches 400(0)-400(15) and the data node switches being deactivated by inactive load signals Load0 and Load1. As previously described, the active PreF signal causes the data input logic 410(n) to provide high logic level data Dn and a high logic level complementary data DnF to the dice latches 400(0)-400(15). The high logic level data Dn and high logic level complementary data DnF provided to the dice latches 400(0)-400(15) may enhance resistance of the dice latches to soft errors. Precharging and providing high logic level data Dn and complementary data DnF, however, may be optional. For example, where enhanced resistance to soft errors is not desired or necessary, precharging and providing high logic level data Dn and complementary data DnF may be excluded during operation. However, where enhanced resistance to soft errors is desirable, precharging and providing high logic level data Dn and complementary data DnF may be included.

To reset the dice latches 400(0)-400(15), an active reset control signal Rst0 is provided to the dice latch control logic 420. The dice latch control logic 420 provides active load signals Load0 and Load1, and further provides an active reset signal Rf (e.g., low level reset signal). The active reset signal Rf is provided to activate the reset circuits Arst and Brst of the dice latches 400(0)-400(15), and the active load signals Load0 and Load1 are provided to the data node switches with data Dn at a low logic level and complementary data DnF at a high logic level. As a result of the activated reset circuits Arst and Brst, the low logic level voltage is not provided to the pull-down circuit AoutPD and BoutPD of the dice latches 400(0)-400(15) and the data nodes Aout and Bout are floating, removing a load on the data nodes. Additionally, with the data node switches 312A and 312B, and 314A and 314B of the dice latches 400(0)-400(15) activated by the active load signals Load0 and Load1, the low logic level data Dn is loaded into the respective dice latches 400(0)-400(15) to provide data Q and Q1 having a low logic level and the high logic level complementary data DnF is loaded into the respective dice latches 400(0)-400(15) to provide data QF and Q1F having a high logic level. The pull-up circuits AoutPU and BoutPU are activated by the low logic level data Q and Q1 to pull up the respective data nodes Aout and Bout (which are floating and the load on the data nodes is reduced) to the high logic level voltage. The pull-down circuits AinPD and BinPD are activated by the high logic level voltage of the data nodes Bout and Aout, and pull down the respective data nodes Ain and Bin to the low logic level voltage.

Thus, when an active reset control signal Rst0 is provided to the dice latch control logic 420, the reset circuits Arst and Brst for the dice latches 400(0)-400(15) receive the active reset signal Rf and the low logic level voltage is no longer provided to the data nodes Aout and Bout to reduce the loads on the data nodes Aout and Bout. Additionally, active load signals Load0 and Load1 are provided to activate the data node switches, and a low logic level is written to and latched by the dice latches 400(0)-400(15) (e.g., data Q and Q1 at a low logic level and data QF and Q1F at a high logic level). In this manner, the dice latches 400(0)-400(15), as well as other dice latches that are provided the active reset signal Rf, the active load signals Load0 and Load1, and the low logic level data Dn and high logic level complementary data DnF are reset to have a low logic level latched for data Q and Q1.

FIG. 5 is a schematic diagram of a dice latch control logic 500 according to an embodiment of the disclosure and a dice latch 510. In some embodiments of the disclosure, the dice latch circuit 510 is included in the redundancy latches 120 and the dice latch control logic 500 is included in the control circuit 130 of the semiconductor device 100 of FIG. 1.

The dice latch control logic 500 includes load control logic 522 and reset control logic 530. The dice latch control logic 500 receives load control signals LoadCt10 and LoadCt11, and a reset control signal Rst0.

The reset control logic 530 includes reset signal circuit 532 and reset signal circuit 534. The reset control signal Rst0 is provided to the reset signal circuits 532 and 534 of the reset control logic through a buffer circuit. The reset signal circuit 532 provides a reset signal Rf0 that is complementary to the reset control signal Rst0, and the reset signal circuit 534 provides a reset signal Rf1 that is complementary to the reset control signal Rst0. When an active reset control signal Rst0 (e.g., active high signal) is provided to the dice latch control logic 500, the reset signal circuit 532 provides an active reset signal Rf0 (e.g., active low signal) and the reset signal circuit 534 provides an active reset signal Rf1 (e.g., active low signal).

The load control logic 522 includes load signal logic 524 and load signal logic 526. The load control logic 522 is provided the load control signals LoadCt10 and LoadCt11. The load signal logic 524 provides load signals Load0 and Load0F based on the load control signals LoadCt10 and LoadCt11. The load signal Load0F is complementary to the load signal Load0. The load signal logic 526 provides load signals Load1 and Load1F based on the load control signals LoadCt10 and LoadCt11. The load signal Load1F is complementary to the load signal Load1. When the reset control signal Rst0 is active to cause a reset, the load control signals LoadCt10 and LoadCt11 provided to the load signal logic 524 and 526 both have a high logic level. As a result, the load signal logic 524 provides inactive load signals Load0 and Load0F (e.g., inactive low Load0 signal and inactive high Load0F signal) when the reset control signal Rst0 is active (e.g., active high signal). The load signal logic 526 likewise provides inactive load signals Load1 and Load1F (e.g., inactive low Load1 signal and inactive high Load1F signal) when the reset control signal Rst0 is active (e.g., active high signal).

The load control logic 522 provides the load signals Load0 and Load0F using load signal logic that is separate from the load signal logic used to provide the load signals Load1 and Load1F. For example, in the embodiment of FIG. 5, as previously described, the load signals Load0 and Load0F are provided by load signal logic 524 and the load signals Load1 and Load1F are provided by load signal logic 526. In this manner, the load signals Load1 and Load1F are not dependent on the load signals Load0 and Load0F, and vice versa. In the event the load signals Load0 and/or Load0F become unreliable due to an error or defective circuits of the load signal logic 524, the load signals Load1 and Load1F should not be affected because the load signal logic 526 may not be affected by problems of the load signal logic 524. Similarly, in the event the load signals Load1 and/or Load1F become unreliable due to an error or defective circuits of the load signal logic 526, the load signals Load0 and Load0F should not be affected because the load signal logic 524 may not be affected by problems of the load signal logic 526.

Similarly, the reset control logic 530 provides the reset signal Rf0 using a reset signal circuit that is separate from the reset signal circuit used to provide the reset signal Rf1. For example, in the embodiment of FIG. 5, as previously described, the reset signal Rf0 is provided by the reset signal circuit logic 532 and the reset signal Rf1 is provided by the reset signal circuit 534. In this manner, the reset signal Rf0 is separately provided from the reset signal Rf1. In the event the reset signal Rf0 becomes unreliable due to an error or defect of the reset signal circuit 532, the reset signal Rf1 should not be affected because the reset signal circuit 534 may not be affected by problems of the reset signal circuit 532. Likewise, in the event the reset signal Rf1 becomes unreliable due to an error or defect of the reset signal circuit 534, the reset signal Rf0 should not be affected because the reset signal circuit 532 may not be affected by problems of the reset signal circuit 534.

The dice latch 510 shown in FIG. 5 is provided the control signals from the load control logic 522. FIG. 5 shows an example dice latch 510 that includes 16 transistors, and is provided the load signals Load0, Load0F, Load1, and Load1F, and is also provided the reset signals Rf0 and Rf1. However, in some embodiments of the disclosure, the dice latch 510 includes the dice latch 200 instead of the 16 transistor dice latch shown in FIG. 5. In such embodiments, the dice latch 510 is provided the load signals Load0 and/or Load1 by the load control logic 522. In some embodiments of the disclosure, the dice latch 510 includes the dice latch 300 instead of the 16 transistor dice latch shown in FIG. 5. In such embodiments, the dice latch 510 is provided the load signals Load0 and/or Load1 by the load control logic 522 and also provided the reset signals Rf0 and/or Rf1 by the reset control logic 530.

With reference to the 16 transistor dice latch shown in FIG. 5, in operation, data D0 and data D1 are loaded into the dice latch 510 and latched to be provided as data Q and Q1 and complementary data QF and Q1F when the dice latch control logic 500 provides active load signals Load0 and Load0F and Load1 and Load1F, and further provides inactive reset signals Rf0 and Rf1.

For example, assuming that data D0 and D1 are both a high logic level (e.g., a data "1"; a high logic level voltage), when active load signals Load0 and Load0F and Load1 and Load1F are provided, the high logic level voltage of the data "1" for data D0 and D1 causes the data Q and Q1 to have the high logic level. Additionally, the high logic level voltage of the data "1" for data D0 and D1 causes the complementary data Q1F and the complementary data QF to be pulled down to a low logic level (e.g., a data "0"; a low logic level voltage). The dice latch control logic 500 provides inactive load signals Load0 and Load0F and Load1 and Load1F, and the data Q and Q1 are isolated from the data D0 and D1. Additionally, the inactive load signals Load0 and Load0F and Load1 and Load1F, along with the low logic level of the complementary data QF and Q1F, cause the data Q and Q1 to be maintained at the high logic level. As a result, the data Q and Q1 at the high logic level and the complementary data QF and Q1F at the low logic level are latched.

In another example, assuming that data D0 and D1 are both a low logic level (e.g., a data "0"; a low logic level voltage), when active load signals Load0 and Load0F and Load1 and Load1F are provided, the low logic level voltage of the data "0" for data D0 and D1 causes the data Q and Q1 to have the low logic level. Additionally, the low logic level voltage of the data "0" for data D0 and D1 causes the complementary data Q1F and the complementary data QF to be pulled up to a high logic level (e.g., a data "1"; a high logic level voltage). The dice latch control logic 500 provides inactive load signals Load0 and Load0F and Load1 and Load1F, and the data Q and Q1 are isolated from the data D0 and D1. Additionally, the inactive load signals Load0 and Load0F and Load1 and Load1F, along with the high logic level of the complementary data QF and Q1F, cause the data Q and Q1 to be maintained at the low logic level. As a result, the data Q and Q1 at the low logic level and the complementary data QF and Q1F at the high logic level are latched.

To reset the dice latch 510, an active reset control signal Rst0 is provided to the dice latch control logic 500. As previously described, high logic level load control signals LoadCt10 and LoadCt11 are provided to the load control logic 522 when the reset control signal Rst0 is active. As a result, the load signal logic 524 provides inactive load signals Load0 and Load0F and the load signal logic 526 provides inactive load signals Load1 and Load1F. Additionally, the reset control logic 530 provides active reset signals Rf0 and Rf1 (e.g., active low signals) in response to the active reset control signal Rst0.

The inactive load signals Load0/Load0F and Load1/Load1F deactivate the transfer gate providing data D0 to the data node Ain and deactivate the transfer gate providing data D1 to the data node Bin. The inactive load signals Load0/Load0F and Load1/Load1F also activate transistors providing the high logic level voltage and low logic level voltage to the pull-up circuits and the pull-down circuits for the data nodes Ain and Bin.

The active reset signals Rf1 and Rf0 activate p-channel transistors to pull up data nodes Aout and Bout to a high logic level voltage. Additionally, the active reset signals Rf1 and Rf0 prevent the low logic level voltage from being provided to the data nodes Aout and Bout to reduce a load on the data nodes. The high logic level voltage at the data nodes Aout and Bout causes the data nodes Ain and Bin to be pulled down to a low logic level voltage. As a result, the dice latch 510 is reset to latch a reset logic level (e.g., low logic level) for data Q and Q1.

As previously described, the dice latch control logic 500 separately provides the load signals Load0/Load0F from the load signals Load1/Load1F to avoid dependency of the load signals Load1/Load1F on the load signals Load0/Load0F, and vice versa. Additionally, the dice latch control logic 200 separately provides the reset signal Rf0 from the reset signal Rf1 to avoid dependency of the reset signal Rf1 on the reset signal Rf0, and vice versa. The separately provided load signals Load0/Load0F and Load1/Load1F, and separately provided reset signals Rf0 and Rf1 may enhance resistance against malfunction, for example, resulting from soft errors or other defects and errors. Thus, the load signals Load0/Load0F and Load1/Load1F, and reset signals Rf0 and Rf1 separately provided by the dice latch control logic 500 may be provided to dice latches of conventional design, for example, the 16 transistor dice latch shown in FIG. 5. In other embodiments, separate load signals and/or separate reset signals are provided to dice latches according to embodiments of the present disclosure, for example, dice latches 200 and 300 previously shown and described with reference to FIGS. 2 and 3, respectively.

FIG. 6 is a layout diagram for a dice latch according to an embodiment of the disclosure. In some embodiments of the disclosure, the layout of FIG. 6 may be used for the dice latch 200 of FIG. 2.

The layout includes several groups of transistors arranged along a y-direction and further includes at least one group of transistors arranged with an offset along an x-direction from the other groups that are arranged along the y-direction. In FIG. 6, the layout includes groups of transistors 612, 614, 616, 618, 622, and 624. Groups of transistors 612, 614, 616, 618, and 622 are arranged along the y-direction and the group of transistors 624 is arranged with an offset along the x-direction from the groups of transistors 612, 614, 616, 618, and 622. A minimum critical Qcrit distance between data nodes Ain and Bin, and between data nodes Aout and Bout is provided by the layout of FIG. 6. The Qcrit distance is shown in FIG. 6 by arrows 608 extending between transistors of the group of transistors 622 and the transistors of the group of transistors 624. The Qcrit distance provided by the layout of FIG. 6 may improve resistance of a dice latch against data errors that may result, for example, from soft errors. In some embodiments of the disclosure, the Qcrit distance is 0.5 um. However, in other embodiments of the disclosure, the Qcrit distance may be greater or less than 0.5 um.

The groups of transistors 612, 614, 616, and 618 each include an active region 632 and gate structures 634. The active region 632 is formed in a substrate and the gate structures 634 are formed on the active region 632. Source/drain regions are formed in the active region on either side of the gate structures 634. Conductive contacts are formed over the source/drain regions to be connected to conductive layers formed over the conductive contacts. The active region 632 is doped with impurities to adjust conductivity and transistor characteristics. The gate structures 634 includes a gate oxide formed on the active region and a polysilicon gate formed on the gate oxide.

Some of the groups of transistors include two or more of the transistors that share a source/drain region. For example, in FIG. 6, groups of transistors 612, 614, 616, and 618 each include two transistors, and the two transistors share a source drain region. For example, the two transistors of the group of transistors 612 share a source/drain region 612sd, the two transistors of the group of transistors 614 share a source/drain region 614sd, the two transistors of the group of transistors 616 share a source/drain region 616sd, and the two transistors of the group of transistors 618 share a source/drain region 618sd.

In some embodiments of the disclosure, with reference to the dice latch 200 of FIG. 2, the group of transistors 612 includes the data node switch 214B coupled to the data node Bout and the pull-down circuit BoutPD; the group of transistors 614 includes the data node switch 212B coupled to the data node Bin and the pull-down circuit BinPD; the group of transistors 616 includes the data node switch 214A coupled to the data node Aout and the pull-down circuit AoutPD; and the group of transistors 618 includes the data node switch 212A coupled to the data node Ain and the pull-down circuit AinPD.

The groups of transistors 622 and 624 each include active regions 636 and gate structures 634. The active regions 636 are formed in a substrate and each of the gate structures 634 is formed on one of the active regions 636. Source/drain regions are formed in each of the active regions 636 on either side of the respective gate structure 634. Conductive contacts are formed over the source/drain regions to be connected to conductive layers formed over the conductive contacts. The active regions 636 are doped with impurities to adjust conductivity and transistor characteristics. The gate structures 634 includes a gate oxide formed on the active region and a polysilicon gate formed on the gate oxide.

In some embodiments of the disclosure, with further reference to the dice latch 200 of FIG. 2, the group of transistors 622 includes the pull-up circuit AinPU and the pull-up circuit BoutPU; and the group of transistors 624 includes the pull-up circuit BinPU and the pull-up circuit AoutPU.

The impurities of the active regions 636 may be different than the impurities of the active regions 632. For example, the conductivity type of the impurities of the active regions 636 provide active regions for p-channel transistors and the conductivity type of the impurities of the active regions 632 provide active regions for n-channel transistors. The polysilicon gates and gate oxides of the gate structures for the groups of transistors of the layout of FIG. 6 may be similarly formed during fabrication. For example, the 634 polysilicon gates and gate oxides of the gate structures for the groups of transistors 612, 614, 616, and 618 may be formed by the same processes as the gate structures 634 for the groups of transistors 622 and 624.

The layout of FIG. 6 further includes dummy polysilicon structures 642 and polysilicon interconnects 652. The polysilicon interconnects 652 couple to the gate structures 634 of the groups of transistors. Conductive contacts are formed on the polysilicon interconnects 652 and the gate structures 634 to be connected to conductive layers formed over the conductive contacts.

Figure 7:
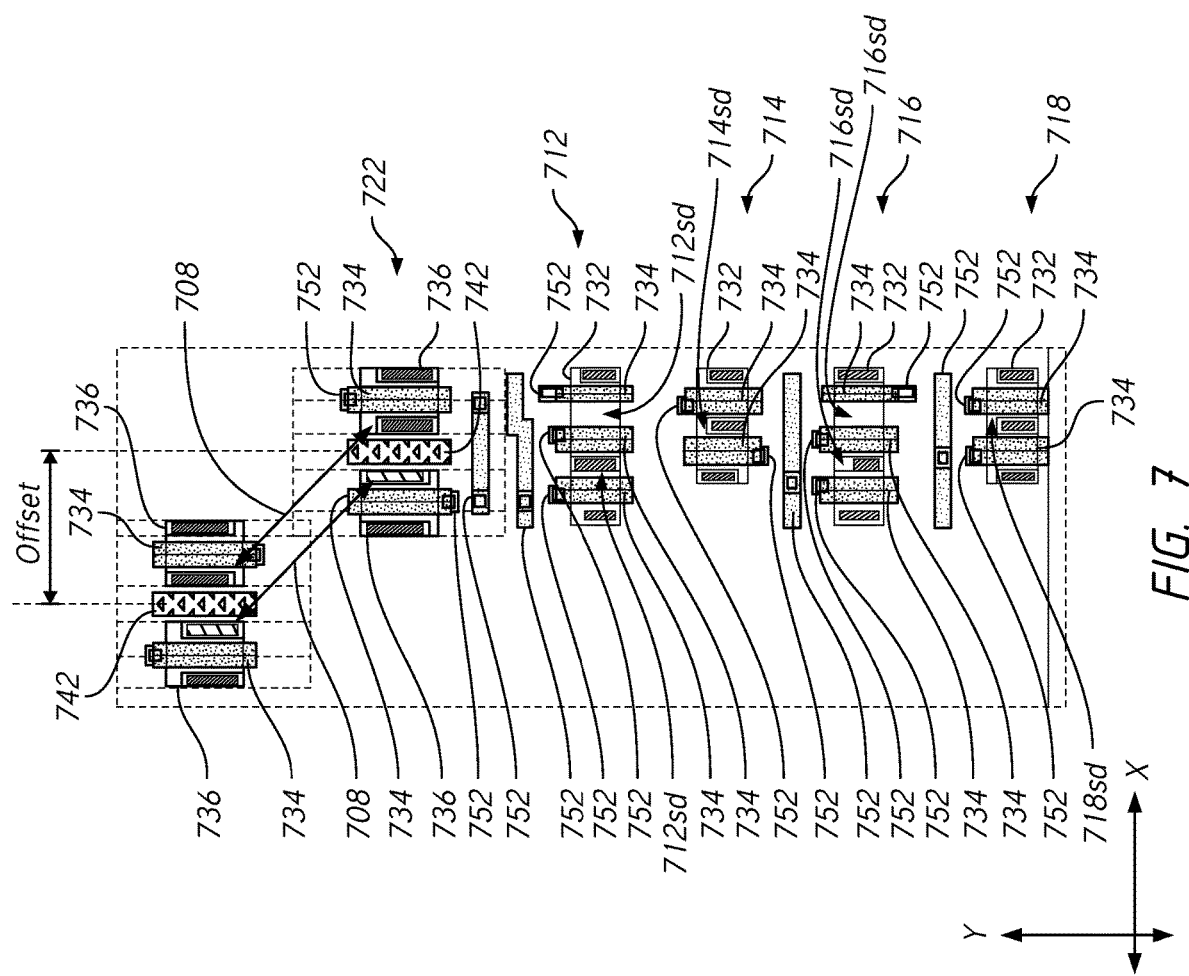
FIG. 7 is a layout diagram for a dice latch according to an embodiment of the disclosure.

FIG. 7 is a layout diagram for a dice latch according to an embodiment of the disclosure. In some embodiments of the disclosure, the layout of FIG. 7 may be used for the dice latch 300 of FIG. 3.

The layout includes several groups of transistors arranged along a y-direction and further includes at least one group of transistors arranged with an offset along an x-direction from the other groups that are arranged along the y-direction. In FIG. 7, the layout includes groups of transistors 712, 714, 716, 718, 722, and 724. Groups of transistors 712, 714, 716, 718, and 722 are arranged along the y-direction and the group of transistors 724 is arranged with an offset along the x-direction from the groups of transistors 712, 714, 716, 718, and 722. A minimum critical Qcrit distance between data nodes Ain and Bin, and between data nodes Aout and Bout is provided by the layout of FIG. 7. The Qcrit distance is shown in FIG. 7 by arrows 708 extending between transistors of the group of transistors 722 and the transistors of the group of transistors 724. The Qcrit distance provided by the layout of FIG. 7 may improve resistance of a dice latch against data errors that may result, for example, from soft errors. In some embodiments of the disclosure, the Qcrit distance is 0.5 um. However, in other embodiments of the disclosure, the Qcrit distance may be greater or less than 0.5 um.

The groups of transistors 712, 714, 716, and 718 each include an active region 732 and gate structures 734. The active region 732 is formed in a substrate and the gate structures 734 are formed on the active region 732. Source/drain regions are formed in the active region on either side of the gate structures 734. Conductive contacts are formed over the source/drain regions to be connected to conductive layers formed over the conductive contacts. The active region 732 is doped with impurities to adjust conductivity and transistor characteristics. The gate structures 734 includes a gate oxide formed on the active region and a polysilicon gate formed on the gate oxide.

Some of the groups of transistors include two or more of the transistors that share a source/drain region. For example, in FIG. 7, groups of transistors 714 and 718 each include two transistors, and the two transistors share a source drain region. For example, the two transistors of the group of transistors 714 share a source/drain region 714sd and the two transistors of the group of transistors 718 share a source/drain region 718sd. Additionally, groups of transistors 712 and 716 each include three transistors, and the three transistors share source drain regions. For example, the three transistors of the group of transistors 712 share source/drain regions 712sd and the three transistors of the group of transistors 716 share source/drain regions 716sd.

In some embodiments of the disclosure, with reference to the dice latch 300 of FIG. 3, the group of transistors 712 includes the data node switch 314B coupled to the data node Bout, the pull-down circuit BoutPD, and the reset circuit Brst; the group of transistors 714 includes the data node switch 312B coupled to the data node Bin and the pull-down circuit BinPD; the group of transistors 716 includes the data node switch 314A coupled to the data node Aout, the pull-down circuit AoutPD, and the reset circuit Arst; and the group of transistors 718 includes the data node switch 312A coupled to the data node Ain and the pull-down circuit AinPD.

The groups of transistors 722 and 724 each include active regions 736 and gate structures 734. The active regions 736 are formed in a substrate and each of the gate structures 734 is formed on one of the active regions 736. Source/drain regions are formed in each of the active regions 736 on either side of the respective gate structure 734. Conductive contacts are formed over the source/drain regions to be connected to conductive layers formed over the conductive contacts. The active regions 736 are doped with impurities to adjust conductivity and transistor characteristics. The gate structures 734 includes a gate oxide formed on the active region and a polysilicon gate formed on the gate oxide.

In some embodiments of the disclosure, with further reference to the dice latch 300 of FIG. 3, the group of transistors 722 includes the pull-up circuit AinPU and the pull-up circuit BoutPU; and the group of transistors 724 includes the pull-up circuit BinPU and the pull-up circuit AoutPU.

The impurities of the active regions 736 may be different than the impurities of the active regions 732. For example, the conductivity type of the impurities of the active regions 736 provide active regions for p-channel transistors and the conductivity type of the impurities of the active regions 732 provide active regions for n-channel transistors. The polysilicon gates and gate oxides of the gate structures for the groups of transistors of the layout of FIG. 7 may be similarly formed during fabrication. For example, the 734 polysilicon gates and gate oxides of the gate structures for the groups of transistors 712, 714, 716, and 718 may be formed by the same processes as the gate structures 734 for the groups of transistors 722 and 724.

The layout of FIG. 7 further includes dummy polysilicon structures 742 and polysilicon interconnects 752. The polysilicon interconnects 752 couple to the gate structures 734 of the groups of transistors. Conductive contacts are formed on the polysilicon interconnects 752 and the gate structures 734 to be connected to conductive layers formed over the conductive contacts.

As previously described, groups of transistors are arranged along the y-direction and at least one group of transistors is arranged with an offset along the x-direction relative to the groups of transistors arranged along the y-direction. The arrangement of the groups of transistors provides a layout that accommodates including a relatively high density of conductive lines that are arranged over the groups of transistors.

Figure 8:
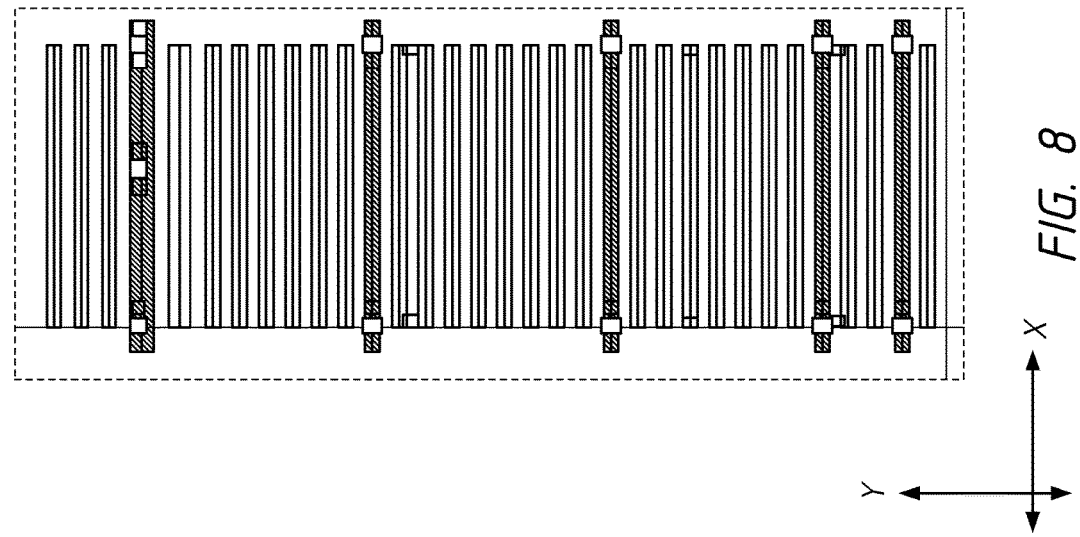
FIG. 8 is an example layout for conductive lines that are over the groups of transistors.

FIG. 8 is an example layout for conductive lines that are arranged over the groups of transistors. For example, the layout of conductive lines of FIG. 8 may be used with the layout of a dice latch of FIG. 7. Other layouts of conductive lines may be used with the layout of the dice latch of FIG. 7 in other embodiments of the disclosure. The conductive lines extend along the x-direction and arranged adjacent to one another along the y-direction. The conductive lines may contact various ones of the conductive contacts shown in FIG. 7, for example, the conductive contacts formed over the source/drain regions and/or the polysilicon interconnects.

Although various embodiments of the disclosure have been disclosed, it will be understood by those skilled in the art that the embodiments extend beyond the specifically disclosed embodiments to other alternative embodiments and/or uses and obvious modifications and equivalents thereof. In addition, other modifications which are within the scope of this disclosure will be readily apparent to those of skill in the art based on this disclosure. It is also contemplated that various combination or sub-combination of the specific features and aspects of the embodiments may be made and still fall within the scope of the disclosure. It should be understood that various features and aspects of the disclosed embodiments can be combined with or substituted for one another in order to form varying mode of the disclosed embodiments. Thus, it is intended that the scope of at least some of the present disclosure should not be limited by the particular disclosed embodiments described above.

From the foregoing it will be appreciated that, although specific embodiments of the disclosure have been described herein for purposes of illustration, various modifications may be made without deviating from the spirit and scope of the disclosure. Accordingly, the scope of the disclosure should not be limited any of the specific embodiments described herein.

What is claimed is:

1. An apparatus, comprising:
    a plurality of dice latches coupled in parallel and configured to latch respective data;
    dice latch control logic configured to receive a load control signal and a reset control signal and further configured to provide a reset signal and further provide first and second load signals to the plurality of dice latches, the reset signal based on the reset control signal and the first and second load signals based on the load control signal and the reset control signal; and
    a plurality of data input logic, each coupled to a respective one of the plurality of dice latches, each of the plurality of data input logic configured to receive a precharge control signal and respective input data and further configured to provide data and complementary data to the respective one of the plurality of dice latches.

2. The apparatus of claim 1, wherein the data and complementary data have complementary logic levels based on the input data when the precharge control signal is inactive.

3. The apparatus of claim 2, wherein the data and complementary data have the same logic level when the precharge control signal is active.

4. The apparatus of claim 1, wherein the dice latch control logic comprises first load control logic configured to provide an active first load signal and second load control logic configured to provide an active second load signal when the load control signal is active and the reset control signal is inactive.

5. The apparatus of claim 4, wherein the dice latch control logic is further configured to provide the active first and second load signals when the reset control signal is active regardless of a state of the load control signal.

6. The apparatus of claim 5, wherein the dice latch control logic further comprises reset control logic configured to provide the reset signal having a logic level complementary to a logic level of the reset control signal.

7. The apparatus of claim 1, wherein the dice latch control logic further comprises reset control logic configured to provide the reset signal having a logic level complementary to a logic level of the reset control signal.

8. The apparatus of claim 1, wherein a data input logic of the plurality of data input logic comprises:
    first data logic configured to provide the data having a same logic level as the input data when the precharge control signal is inactive; and
    second data logic configured to provide the complementary data having a logic level complementary to the input data when the precharge control signal is inactive.

9. The apparatus of claim 8, wherein the first data logic and the second data logic are further configured to provide the data and complementary data having the same logic level when the precharge control signal is active.

10. The apparatus of claim 1, wherein a dice latch of the plurality of dice latches coupled in parallel comprises:
    a latch circuit configured including first and second data nodes, and third and fourth data nodes;
    first and second data node switches coupled to the first and second data nodes, respectively, the first data node switch configured to provide the data from the respective data input logic to the first data node when activated by an active first load signal and the second data node switch configured to provide the data from the respective data input logic to the second data node when activated by an active second load signal; and
    third and fourth data node switches coupled to the third and fourth data nodes, respectively, the third data node switch configured to provide the complementary data from the respective data input logic to the third data node when activated by the active first load signal and the fourth data node switch configured to provide the complementary data from the respective data input logic to the fourth data node when activated by the active second load signal.

11. The apparatus of claim 10, wherein the latch circuit is further configured to latch the data at the first and second data nodes and to latch the complementary data at the third and fourth data nodes when the data and complementary data are provided by the respective data node switch.

12. The apparatus of claim 11, wherein the latch circuit comprises:
a first reset circuit configured to reduce a load from the third data node when activated by an active reset signal; and
a second reset circuit configured to reduce a load from the fourth data node when activated by the active reset signal.

13. The apparatus of claim 12 wherein the latch circuit further comprises:
a first pull-up circuit and a first pull-down circuit coupled to the first data node;
a second pull-up circuit and a second pull-down circuit coupled to the second data node;
a third pull-up circuit and a third pull-down circuit coupled to the third data node; and
a fourth pull-up circuit and a fourth pull-down circuit coupled to the fourth data node,
wherein the first reset circuit is coupled to the third pull-down circuit and configured to be provided a logic level voltage, and
wherein the second reset circuit is coupled to the fourth pull-down circuit and configured to be provided the logic level voltage.

* * * * *